United States Patent
Tsutsui et al.

(10) Patent No.: US 11,894,816 B2
(45) Date of Patent: Feb. 6, 2024

(54) POWER AMPLIFIER CIRCUIT

(71) Applicant: Murata Manufacturing Co., Ltd., Kyoto (JP)

(72) Inventors: Takayuki Tsutsui, Kyoto (JP); Satoshi Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 375 days.

(21) Appl. No.: 17/215,208

(22) Filed: Mar. 29, 2021

(65) Prior Publication Data

US 2021/0305951 A1 Sep. 30, 2021

(30) Foreign Application Priority Data

Mar. 30, 2020 (JP) .................. 2020-059767

(51) Int. Cl.
*H03F 3/24* (2006.01)
*H03F 1/52* (2006.01)

(52) U.S. Cl.
CPC ............... *H03F 3/245* (2013.01); *H03F 1/52* (2013.01); *H03F 2200/222* (2013.01); *H03F 2200/387* (2013.01); *H03F 2200/451* (2013.01)

(58) Field of Classification Search
CPC ....................................................... H03F 3/245
See application file for complete search history.

(56) References Cited

U.S. PATENT DOCUMENTS

| | | | |
|---|---|---|---|
| 6,580,321 B1 | 6/2003 | Arell et al. | |
| 2006/0066398 A1* | 3/2006 | Akamine | H03G 3/3047 330/136 |
| 2008/0180169 A1* | 7/2008 | Ripley | H03F 1/0233 330/285 |
| 2018/0316311 A1* | 11/2018 | Gebeyehu | H03F 3/24 |
| 2020/0136559 A1* | 4/2020 | Shimamoto | H03F 3/191 |
| 2022/0321065 A1* | 10/2022 | Costantini | H03F 1/52 |

* cited by examiner

*Primary Examiner* — Patricia T Nguyen
(74) *Attorney, Agent, or Firm* — Pearne & Gordon LLP

(57) ABSTRACT

A power amplifier circuit includes a first amplifier that amplifies a first RF signal and outputs a second RF signal, a second amplifier that amplifies the second RF signal and outputs a third RF signal, a bias circuit that supplies a bias current or voltage to the first or second amplifier, and a bias adjustment circuit that adjusts the bias current or voltage on the basis of the first RF signal, the second RF signal, or the third RF signal. The bias adjustment circuit includes a first diode having an anode to which a control signal indicating a signal based on the first, second, or third RF signal is inputted, and a cathode connected to a ground. The bias circuit includes a bias transistor that outputs the bias current or voltage on the basis of a voltage at the anode of the first diode.

13 Claims, 12 Drawing Sheets

POWER AMPLIFIER CIRCUIT

CROSS REFERENCE TO RELATED APPLICATION

This application claims priority from Japanese Patent Application No. 2020-059767 filed on Mar. 30, 2020. The content of this application is incorporated herein by reference in its entirety.

BACKGROUND OF THE DISCLOSURE

1. Field of the Disclosure

The present disclosure relates to a power amplifier circuit.

2. Description of the Related Art

A power amplifier circuit that amplifies a radio frequency (RF) signal to be transmitted to a base station is used in a mobile communication terminal, such as a cellular phone. The power amplifier circuit includes a transistor that amplifies the RF signal and a bias circuit that controls a bias point of the transistor. One known example of the power amplifier circuit includes a protection circuit for controlling that bias voltage.

BRIEF SUMMARY OF THE DISCLOSURE

In recent years, because the load loss of a power amplifier circuit increases as a front-end circuit configuration is complicated, the power amplifier circuit has been required to output higher power. For the power amplifier circuit capable of outputting high power, when the load changes, the amplitudes of the current and voltage widely change in response to variations in the phase of the load. The power amplifier circuit described in U.S. Pat. No. 6,580,321 B1 possesses withstand power characteristics improved by having a protection circuit and controlling a bias voltage. In the power amplifier circuit described in the above-mentioned Patent Document, however, because clamp diodes are connected in output matching and an RF signal is detected from an anode of a predetermined diode among the clamp diodes, it has no directivity, and thus it may be affected by reflected waves.

Accordingly, it is an object of the present disclosure to suppress the effect of reflected waves and suppress the power gain when a load changes.

According to preferred embodiments of the present disclosure, a power amplifier circuit includes a first amplifier configured to amplify a first RF signal supplied and to output a second RF signal, a second amplifier configured to amplify the second RF signal supplied and to output a third RF signal, a bias circuit configured to supply a bias current or voltage to the first amplifier or the second amplifier, and a bias adjustment circuit configured to adjust the bias current or voltage on the basis of the first RF signal, the second RF signal, or the third RF signal. The bias adjustment circuit includes a first diode having an anode to which a control signal indicating a signal based on the first RF signal, the second RF signal, or the third RF signal is inputted, and a cathode connected to a ground. The bias circuit includes a bias transistor configured to output the bias current or voltage on the basis of a voltage at the anode of the first diode.

According to the present disclosure, the power amplifier circuit capable of suppressing the effect of reflected waves and suppressing the power gain when a load changes can be provided. Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
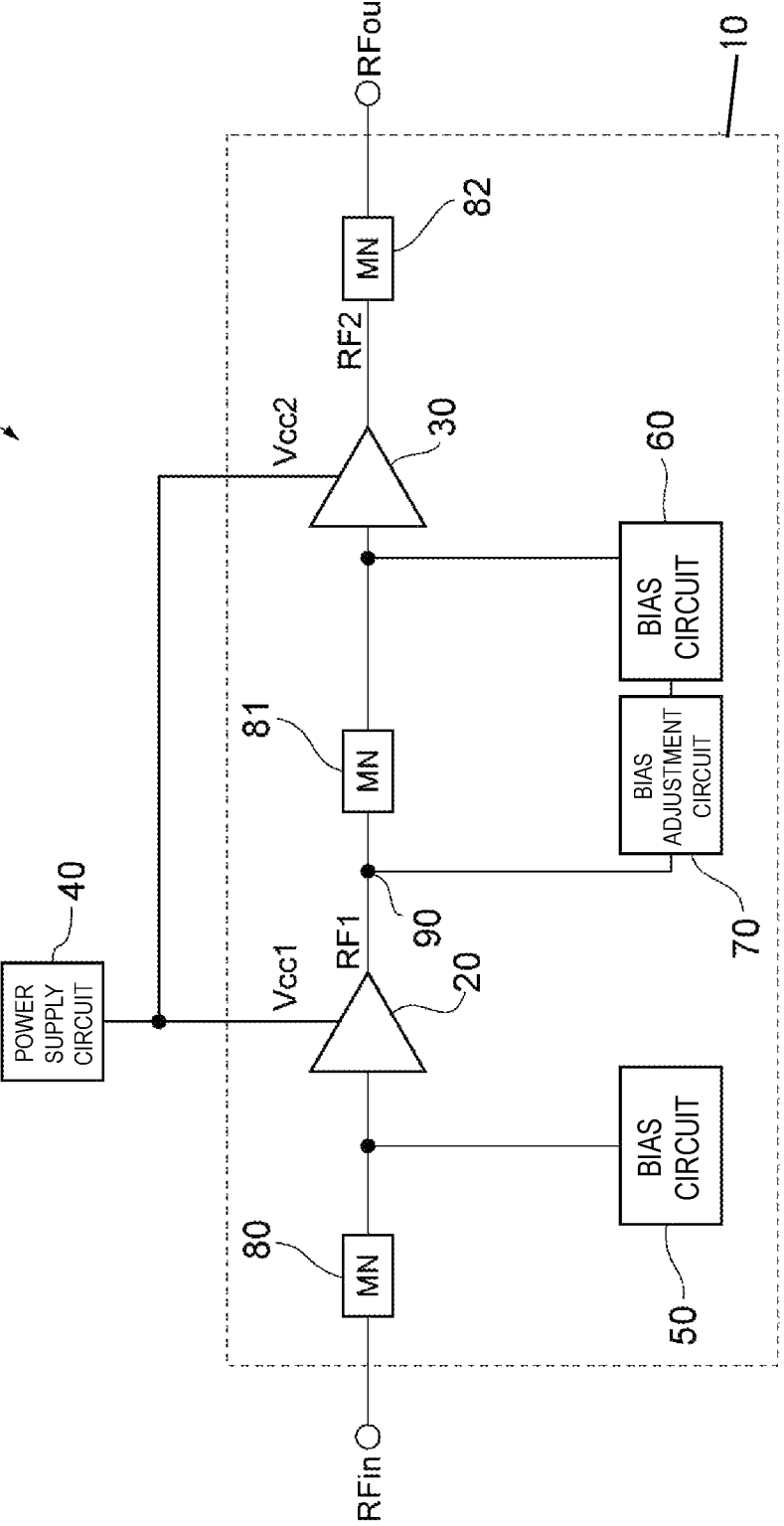
FIG. 1 schematically illustrates a configuration of a power amplification module including a power amplifier circuit according to an embodiment.

Embodiments of the present disclosure are described below with reference to the drawings. Here, circuit elements of the same reference numerals indicate the same circuit elements, and the overlapping description is omitted.

===Configuration of Power Amplification Module 1===

FIG. 1 schematically illustrates a configuration of a power amplification module 1 including a power amplifier circuit 10 according to an embodiment. One example of the power amplification module 1 may be mounted on a mobile communication device, such as a cellular phone, amplify the power of an input signal RFin to a level required to be transmitted to a base station, and output the resultant signal as an amplified signal RFout. One example of the input signal RFin may be a radio frequency (RF) signal modulated by a radio frequency integrated circuit (RFIC) or the like in accordance with a predetermined communication scheme. Examples of the communication standard for the input signal RFin may include the second-generation mobile communication system (2G), the third-generation mobile communication system (3G), the fourth-generation mobile communication system (4G), the fifth-generation mobile communication system (5G), long-term evolution frequency division duplex (LTE-FDD), LTE-time division duplex (LTE-TDD), LTE-Advanced, and LTE-Advanced Pro. Example frequencies of the input signal RFin may range from several hundred MHz to several tens of GHz. The communication standard and the frequencies of the input signal RFin are not limited to the above examples.

One example of the power amplification module 1 may include the power amplifier circuit 10 and a power supply circuit 40.

The power amplifier circuit 10 includes amplifiers 20 and 30, bias circuits 50 and 60, a bias adjustment circuit 70, and matching networks (MNs) 80 to 82.

Each of the amplifiers 20 and 30 amplifies an input RF signal and outputs the resultant signal. The amplifier 20 at the first stage (driver stage) amplifies an input signal RFin (first RF signal) inputted from an input terminal through the matching network 80 and outputs an RF signal RF1 (second RF signal). The amplifier 30 at the subsequent stage (power stage) amplifies the RF signal RF1 supplied from the amplifier 20 through the matching network 81 and outputs an RF signal RF2 (third RF signal). The RF signal RF2 is outputted through the matching network 82 as an amplified signal RFout. An example of each of the amplifiers 20 and 30 may be composed of a transistor, such as a heterojunction bipolar transistor (HBT). Each of the amplifiers 20 and 30 may be composed of a metal-oxide-semiconductor field-effect transistor (MOSFET), instead of the HBT. In that case, the collector, base, and emitter can be read as the drain, gate, and source, respectively. In the following description, the case where the transistor is composed of the HBT is described as an example unless otherwise specified.

The bias circuits 50 and 60 supply a bias current or a bias voltage to the amplifiers 20 and 30, respectively.

The bias adjustment circuit 70 adjusts the bias current or the bias voltage to be supplied from the bias circuit 60 to a transistor Q2 on the basis of the RF signal RF1.

The details of the configurations of the amplifier 30, the bias circuit 60, and the bias adjustment circuit 70 are described below.

The matching network (MN) 80 matches the impedance of a circuit at the preceding stage (not illustrated) with that of the amplifier 20. The matching network 81 matches the impedance of the amplifier 20 with that of the amplifier 30. The matching network 82 matches the impedance of the amplifier 30 with that of a circuit at the subsequent stage (not illustrated). An example of each of the matching networks 80 to 82 may include an inductor and a capacitor.

The power supply circuit 40 generates variable power supply voltages Vcc1 and Vcc2 controlled in accordance with an envelope of the RF signal and supplies them to the amplifiers 20 and 30, respectively. In that way, the power amplification module 1 operates in accordance with the so-called envelope tracking (ET) scheme. Because the power amplification module 1 complies with the ET scheme, the power efficiency is improved in comparison with, for example, the case where it complies with the average power tracking (APT) scheme. The power supply circuit 40 may be included or not included in the power amplification module 1.

==Configuration of Power Amplifier Circuit 10==

Figure 2:
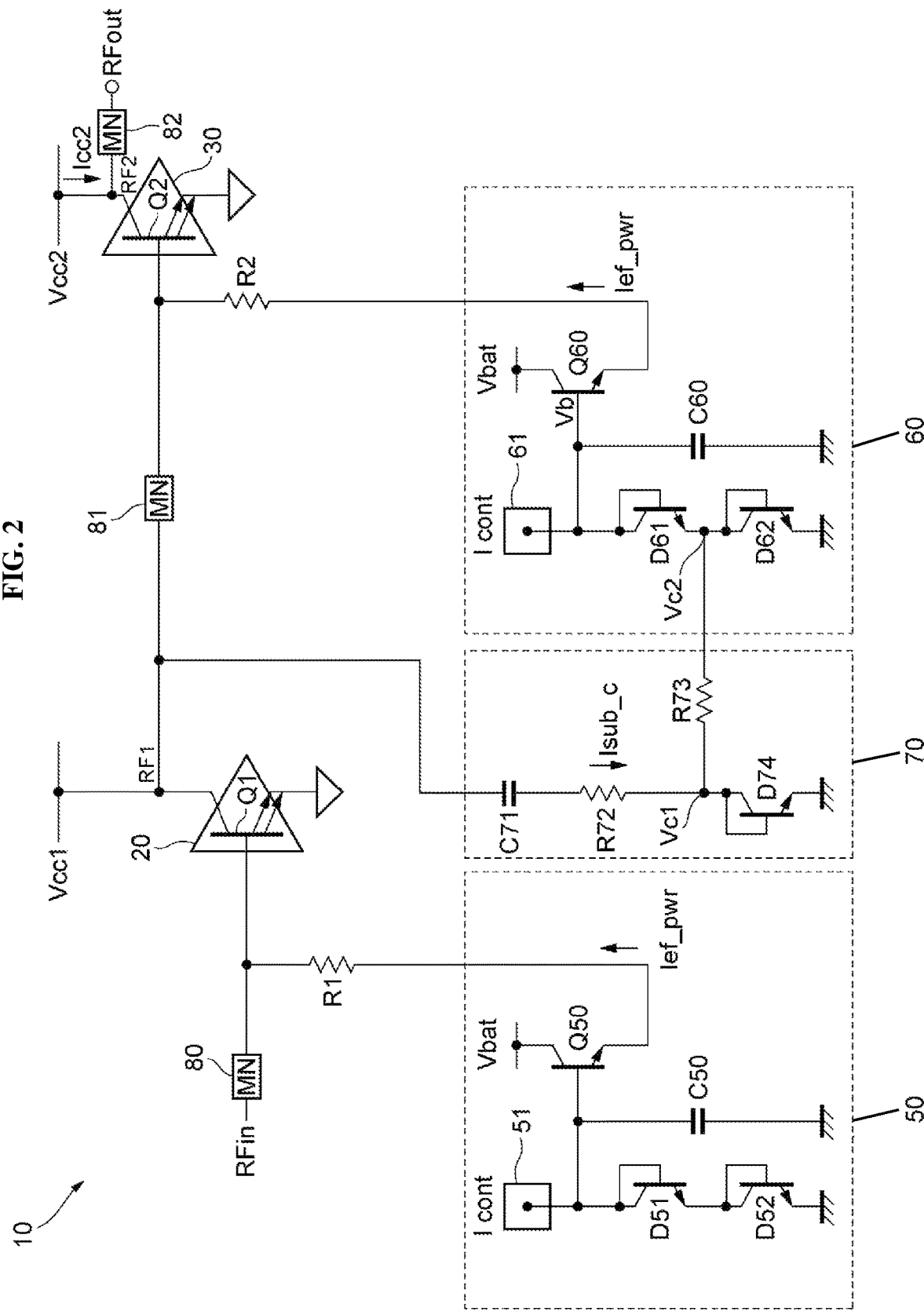
FIG. 2 illustrates an example configuration of the power amplifier circuit according to the embodiment.

FIG. 2 illustrates an example configuration of the power amplifier circuit 10 according to the present embodiment.

The amplifiers 20 and 30 include transistors Q1 and Q2, respectively. Of the transistor Q1, the collector receives the variable power supply voltage Vcc1 supplied, the base receives the input signal RFin (first RF signal) supplied through the matching network 80, and the emitter is grounded. The RF signal RF1 (second RF signal), in which the input signal RFin is amplified, is outputted from the collector of the transistor Q1. Of the transistor Q2, the collector receives the variable power supply voltage Vcc2 (that is, the voltage corresponding to the variable power supply voltage Vcc1) supplied, the base receives the RF signal RF1 supplied through the matching network 81, and the emitter is grounded. The RF signal RF2 (third RF signal), in which the RF signal RF1 is amplified, is outputted from the collector of the transistor Q2.

The bias circuit 50 supplies a bias current or a bias voltage for controlling a bias point of the transistor Q1 to the base of the transistor Q1 through a resistor R1. Specifically, the bias circuit 50 includes diodes D51 and D52, a transistor Q50, a capacitor C50, and a power supply terminal 51.

The diodes D51 and D52 are connected in series. An example of each of the diodes D51 and D52 may be composed of a diode-connected bipolar transistor. The diode connection is the connecting of the base and collector of a bipolar transistor. The diode-connected bipolar transistor behaves as a double-pole element equivalent to the diode. Of the two diode-connected terminals of the bipolar transistor, the terminal with a higher potential during a forward bias is referred to as "anode," and the terminal with a lower potential is referred to as "cathode." The diodes D51 and D52 may also be composed of p-n junction diodes, instead of the diode-connected bipolar transistors.

The anode of the diode D51 receives a constant voltage or a constant current supplied from the power supply terminal 51 and is connected to a ground with the capacitor C50 disposed therebetween. The anode of the diode D52 is connected to the cathode of the diode D51, and the cathode of the diode D52 is grounded. The capacitor C50 is optional.

Of the transistor Q50, the collector receives a battery voltage Vbat (power supply voltage) supplied, and the base is connected to the anode of the diode D51. The emitter of the transistor Q50 is connected to the base of the transistor Q1 with the resistor R1 disposed therebetween. Thus, the bias current is supplied to the base of the transistor Q1.

The bias circuit 60 supplies a bias current or bias voltage for controlling a bias point of the transistor Q2 to the base of the transistor Q2 through a resistor R2. Specifically, the bias circuit 60 includes diodes D61 and D62, a transistor Q60, a capacitor C60, and a power supply terminal 61. In the following description, for the sake of explanation, the bias circuit 60 that supplies the bias current to the transistor Q2 is described.

The diode D61 (third diode) and the diode D62 (second diode) are connected in series. An example of each of the diodes D61 and D62 may be composed of a diode-connected bipolar transistor. The diodes D61 and D62 may also be composed of p-n junction diodes, instead of the diode-connected bipolar transistors.

The anode of the diode D61 receives a constant voltage or a constant current supplied from the power supply terminal 61 and is connected to a ground with the capacitor C60 disposed therebetween. The anode of the diode D62 is connected to the cathode of the diode D61, and the cathode of the diode D62 is grounded. The capacitor C60 is optional.

The anode of the diode D62 is connected to the anode of a diode D74 with a resistor R73 disposed therebetween.

Of the transistor Q60 (bias transistor), the collector receives the battery voltage Vbat (power supply voltage) supplied, and the base is connected to the anode of the diode D61. The emitter of the transistor Q60 is connected to the base of the transistor Q2 with the resistor R2 disposed therebetween. Thus, the bias current is supplied to the base of the transistor Q2.

The bias adjustment circuit 70 adjusts the bias current to be supplied from the bias circuit 60 to the transistor Q2 on the basis of the RF signal RF1 (second RF signal). One example of the bias adjustment circuit 70 may adjust the bias current to be supplied from the bias circuit 60 to the transistor Q2 by using the so-called self-bias effect of the transistor. Here, one example of the self-bias effect of the transistor is a phenomenon in which when the amplitude of the RF power inputted to the collector increases, the transistor is spuriously turned on, and valleys occur in the waveform of the instantaneous voltage. That is, the bias adjustment circuit 70 operates so as to suppress the bias current to be supplied from the bias circuit 60 to the transistor Q2 as the RF signal RF1 increases. That is, the bias adjustment circuit 70 can prevent the breakage of the transistor Q2 caused by the input of an excessive RF signal RF1.

One example of the bias adjustment circuit 70 may include a capacitor C71, a resistor R72, the resistor R73, and the diode D74 (first diode). One example of the diode D74 may be a diode-connected bipolar transistor. Of the diode D74, the cathode is connected to a ground, and the anode is connected to the anode of the diode D62 with the resistor R73 disposed therebetween. The anode of the diode D74 is connected to a first terminal of the capacitor C71 with the resistor R72 disposed therebetween. A second terminal of the capacitor C71 is connected to the collector of the transistor Q1. That is, the RF signal RF1 is supplied to the anode of the diode D74 through the resistor R72. Here, each of the resistors R72 and R73 has a resistance value for producing a desired bias current on the basis of the characteristics of the power amplifier circuit 10. The diode D74 may also be a p-n junction diode.

==Operations of Power Amplifier Circuit 10==

Operations of the power amplifier circuit 10 are described with reference to FIGS. 3 and 4.

In the following description, for the sake of explanation, the current flowing through the resistor R72 is referred to as Isub_c, and the current outputted from the emitter of the transistor Q60 is referred to as Ief_pwr. That is, the current Ief_pwr is the bias current to be supplied to the base of the transistor Q2. In the following description, the current Ief_pwr may also be called "bias current". In the following description, the voltage at the anode of the diode D74 may be described as Vc1, the voltage at the anode of the diode D62 may be described as Vc2, and the base voltage of the transistor Q60 may be described as Vb. The resistance value of the resistor R72 shall be sufficiently small.

Figure 3:
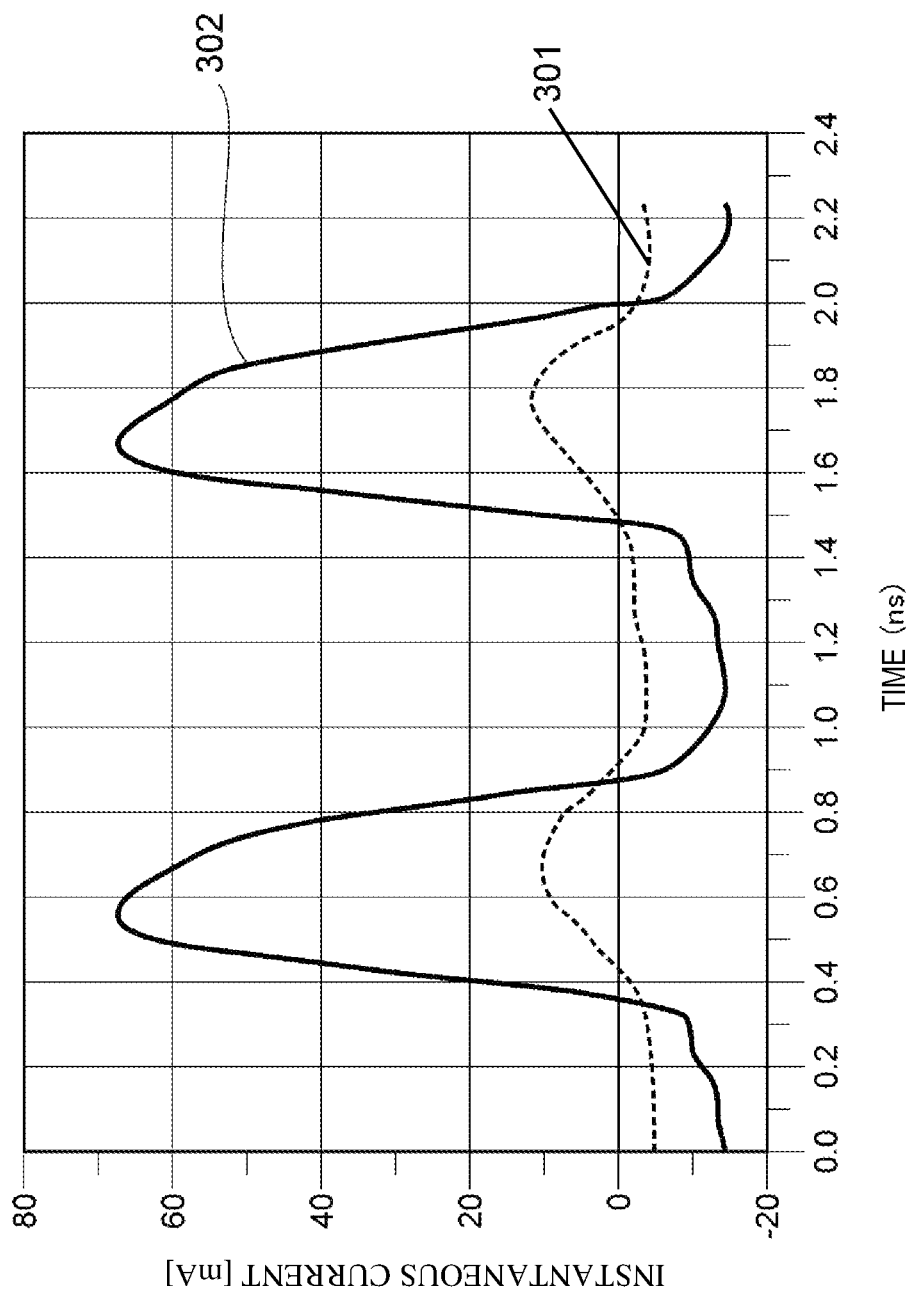
FIG. 3 includes graphs of the relationship between an elapsed time t and a current $Isub\_c$.

FIG. 3 includes graphs of an example of the relationship between the elapsed time t and the current Isub_c. In FIG. 3, the horizontal axis indicates the elapsed time t, and the vertical axis indicates the current Isub_c. A reference numeral 301 in FIG. 3 indicates a graph of the relationship between the current Isub_c for the RF signal RF1 with a predetermined magnitude and the elapsed time t. A reference numeral 302 indicates a graph of the relationship between the current Isub_c for the RF signal RF1 with a magnitude larger than that of the RF signal RF1 indicated by the reference numeral 301 and the elapsed time t.

Figure 4:
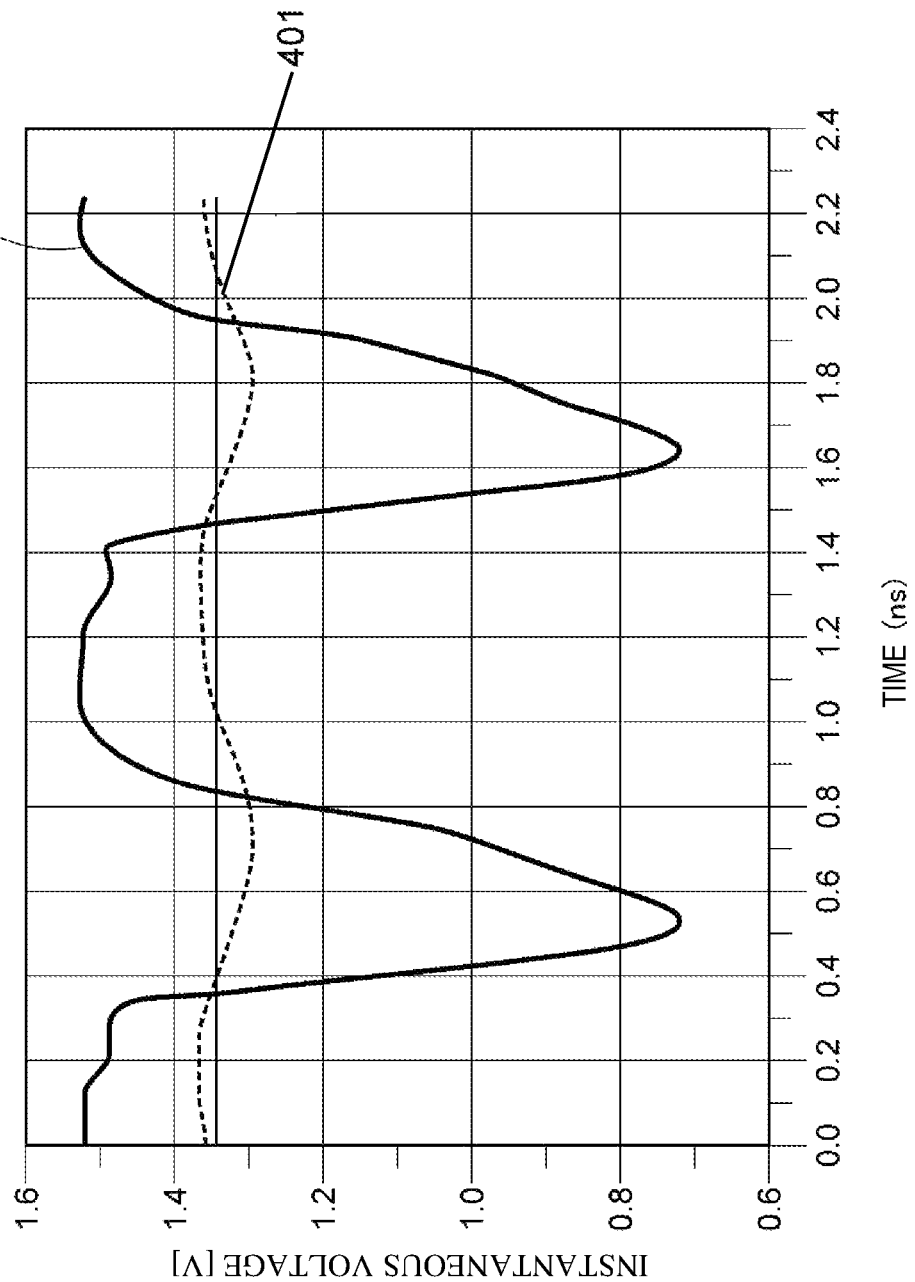
FIG. 4 includes graphs of the relationship between the elapsed time t and a voltage $Vc1$.

FIG. 4 includes graphs of an example of the relationship between the elapsed time t and the voltage Vc1. In FIG. 4, the horizontal axis indicates the elapsed time t, and the vertical axis indicates the voltage Vc1. A reference numeral 401 in FIG. 4 indicates a graph of the relationship between the voltage Vc1 at the anode of the diode D74 for the RF signal RF1 with a predetermined magnitude and the elapsed time t. A reference numeral 402 indicates a graph of the relationship between the voltage Vc1 at the anode of the diode D74 for the RF signal RF1 with a magnitude larger than that of the RF signal RF1 indicated by the reference numeral 401 and the elapsed time t. The horizontal axis (elapsed time t) in FIG. 3 corresponds to the horizontal axis (elapsed time t) in FIG. 4.

Figure 5:
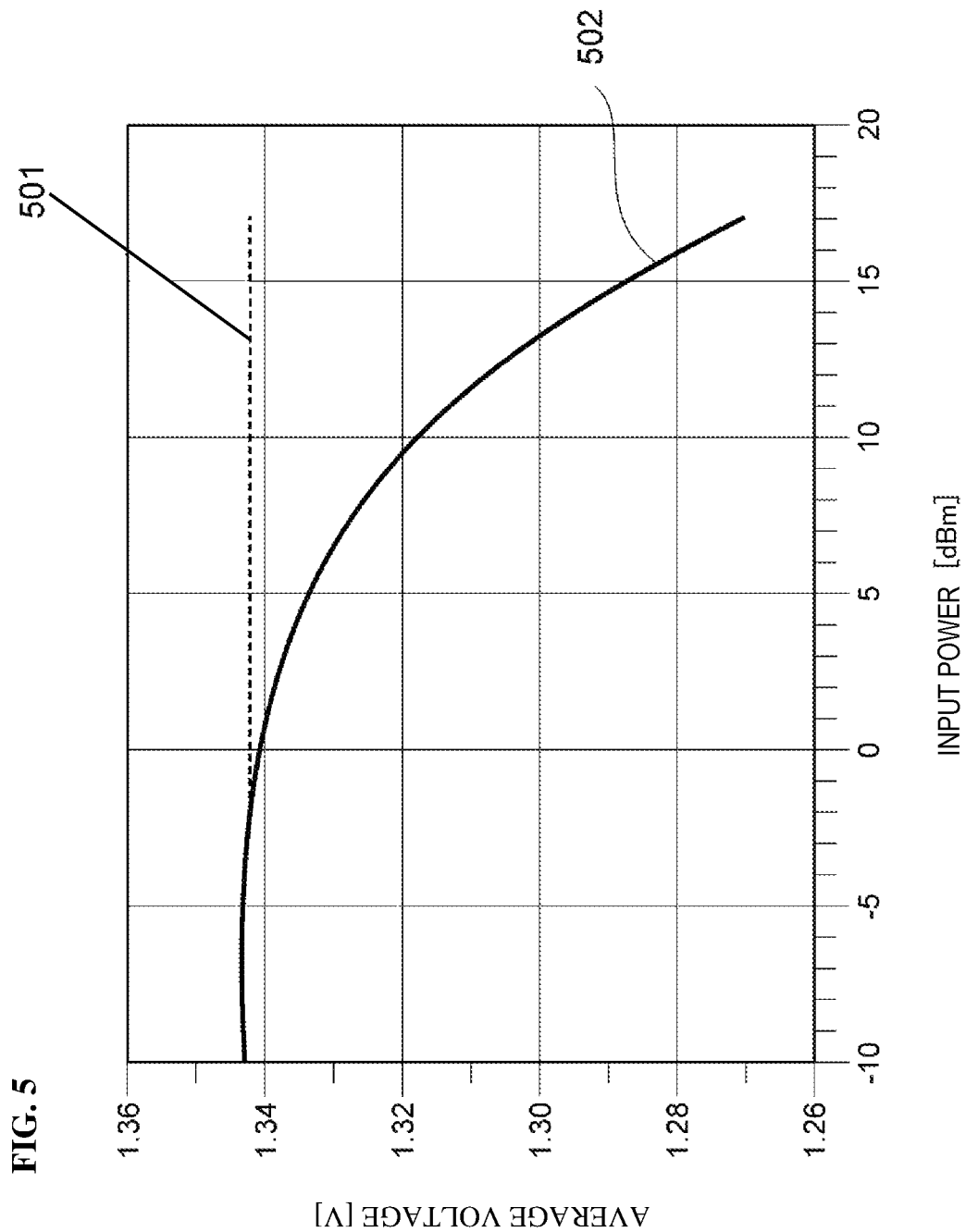
FIG. 5 includes graphs of the relationship between an input power and a voltage $Vc2$.

FIG. 5 includes graphs of the relationship between the input power (RF signal RF1) and the voltage Vc2. In FIG. 5, the horizontal axis indicates the input power, and the vertical axis indicates the voltage Vc2. A reference numeral 501 in FIG. 5 indicates a graph of the relationship between the input power and the voltage Vc2 when the bias adjustment circuit 70 is not included. A reference numeral 502 indicates a graph of the relationship between the input power and the voltage Vc2 when the bias adjustment circuit 70 is included.

Figure 6:
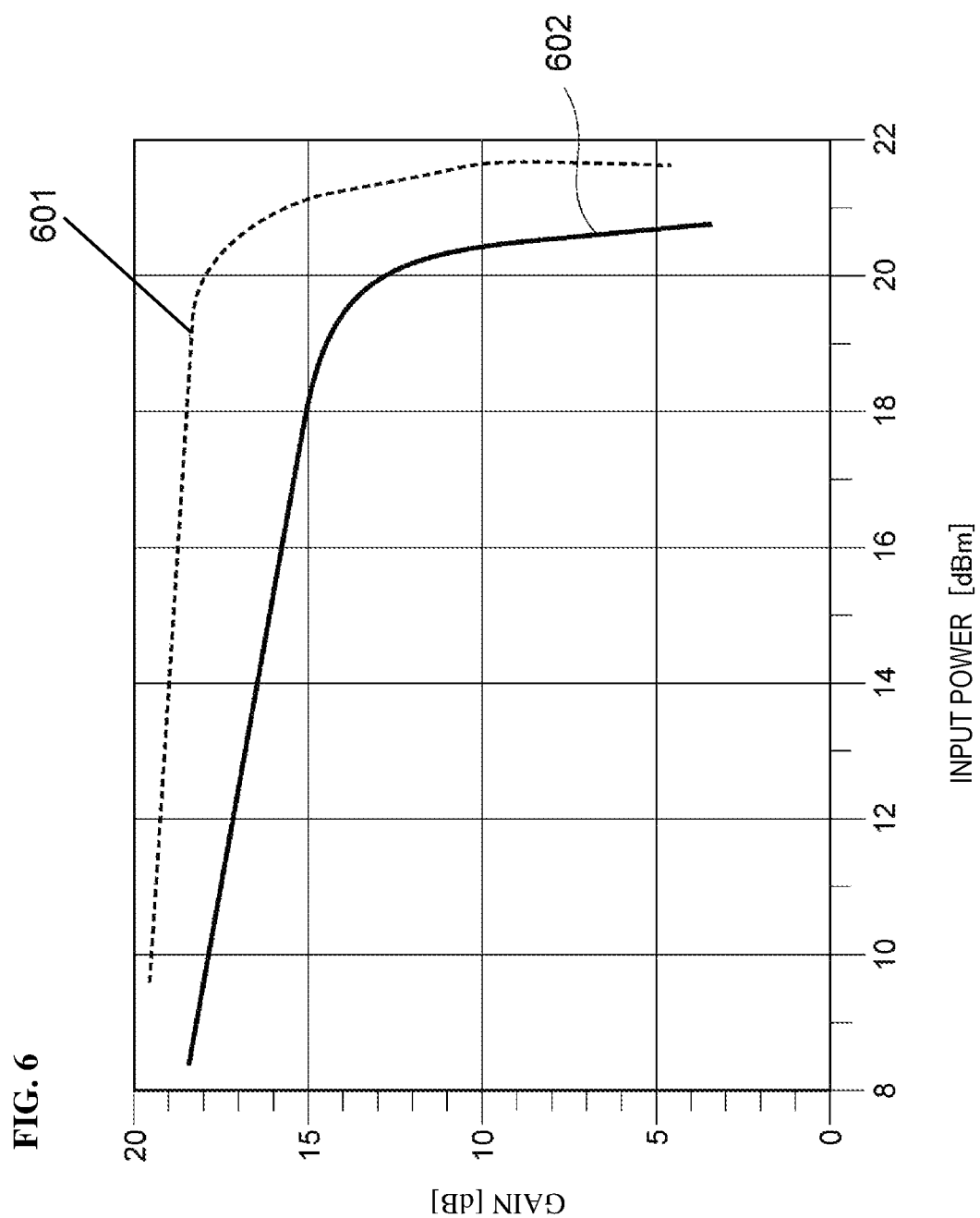
FIG. 6 includes graphs of the relationship between the input power and a gain.

FIG. 6 includes graphs of the relationship between the input power (RF signal RF1) and the gain. In FIG. 6, the horizontal axis indicates the input power, and the vertical axis indicates the gain. A reference numeral 601 in FIG. 6 indicates a graph of the relationship between the input power and the gain when the bias adjustment circuit 70 is not included. A reference numeral 602 indicates a graph of the relationship between the input power and the gain when the bias adjustment circuit 70 is included.

In the following description, the principle of how the bias current to be supplied from the transistor Q60 to the transistor Q2 decreases as the RF signal RF1 in the power amplifier circuit 10 according to the present embodiment increases is described.

When the RF signal RF1 is outputted from the transistor Q1, the current Isub_c flows as indicated by the reference numeral 301 in FIG. 3. With that action, the voltage Vc1 whose phase is opposite to the current Isub_c occurs in the anode of the diode D74 as indicated by the reference numeral 401 in FIG. 4.

When the RF signal RF1 increases, the current Isub_c increases as indicated by the reference numeral 302 in FIG. 3. With that action, valleys of the voltage Vc1 at the anode of the diode D74 occur as indicated by the reference numeral 402 in FIG. 4.

That is caused by the self-bias effect of the diode D74. Specifically, when the amplitude of the RF power inputted to the anode of the diode D74 increases, the diode D74 aims to widen its dynamic range, and thus valleys of the power waveform of the voltage Vc1 occur.

That is, as indicated by the reference numeral 502 in FIG. 5, the average voltage of the voltage Vc1 at the anode of the diode D74 drops, in comparison with the case where the bias adjustment circuit 70 is not included (reference numeral 501).

Thus, the voltage Vc2 at the anode of the diode D62, which is connected to the anode of the diode D74 with the resistor R73 disposed therebetween, drops. Then, the base voltage Vb of the transistor Q60, which is connected to the anode of the diode D62 with the diode D61 disposed between, drops. When the base voltage Vb of the transistor Q60 drops, the current Ief_pwr outputted from the emitter of the transistor Q60 decreases. That is, the bias current for the transistor Q2 decreases.

In other words, because the average voltage of the voltage Vc1 at the anode of the diode D74 drops, a current flows from the anode of the diode D62 through the resistor R73 to the anode of the diode D74. That is, because the current supplied to the base of the transistor Q60 in the current Icont decreases, the bias current to be supplied from the transistor Q60 to the transistor Q2 decreases.

The above reveals that the bias adjustment circuit 70 can reduce the current Ief_pwr, which is the bias current for the transistor Q2, as the RF signal RF1 becomes larger. In other words, as indicated by the reference numeral 602 in FIG. 6, the gain of the power amplifier circuit 10 can be more suppressed, in comparison with the case where the bias adjustment circuit 70 is not included (reference numeral 601). Thus, even when a large RF signal is inputted to the power amplifier circuit 10, because the gain of the power amplifier circuit 10 can be suppressed, its destruction can be avoided.

== Power Amplifier Circuits According to Variations ==

FIGS. 7 to 12 illustrate example configurations of power amplifier circuits 10A, 10B, 10C, 10D, 10E, and 10F according to variations. In the variations, the description on the items common to those in the above-described embodiment is omitted, and only different points are described. In particular, similar operational advantages from similar configurations are not mentioned one by one.

Figure 7:
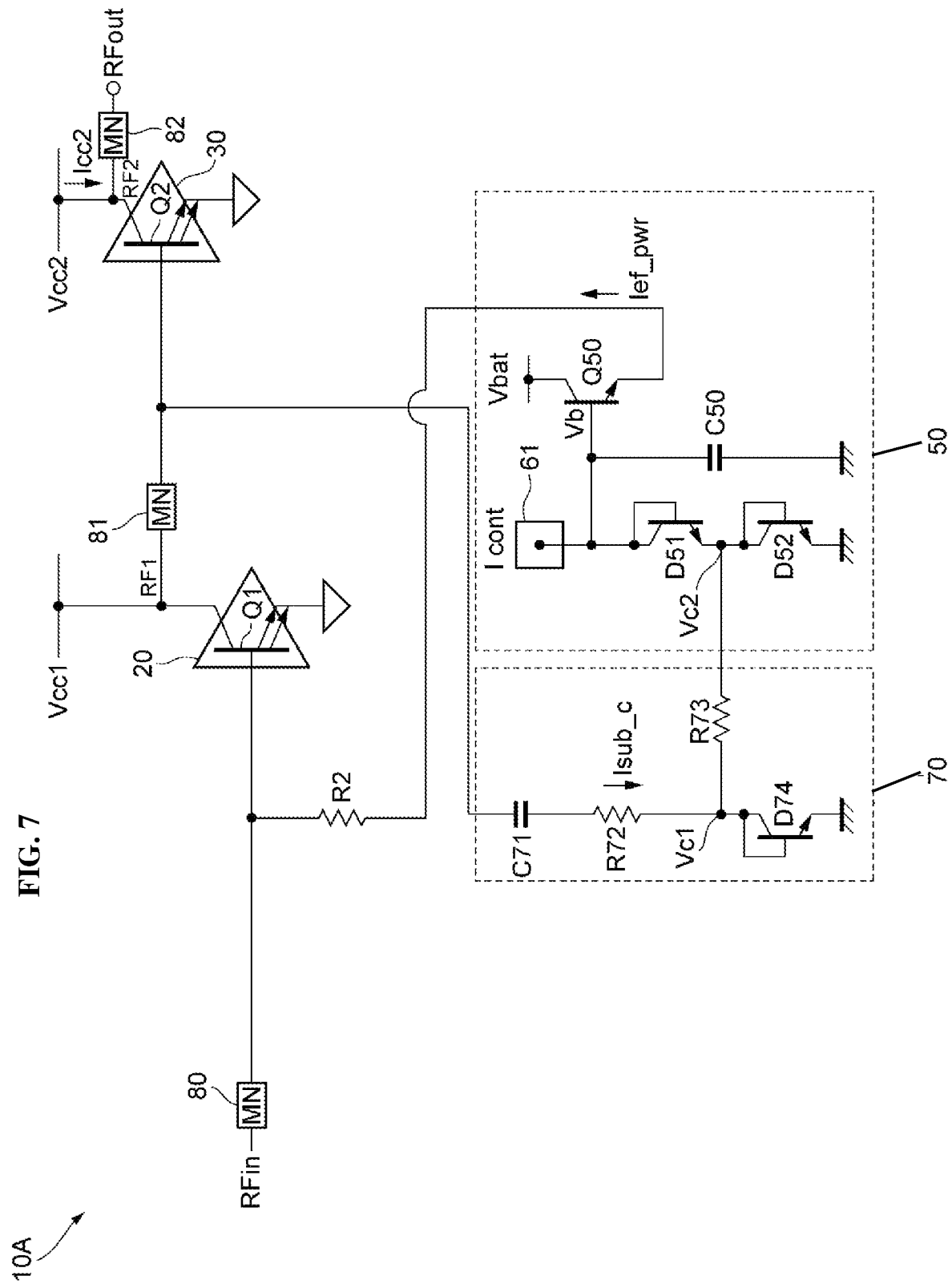
FIG. 7 illustrates an example configuration of a power amplifier circuit according to a variation.

As illustrated in FIG. 7, the power amplifier circuit 10A includes the bias adjustment circuit 70 that adjusts the bias current of the bias circuit 50 on the basis of the RF signal RF1, unlike the power amplifier circuit 10. The diode D74 in the bias adjustment circuit 70 is connected to the anode of the diode D52 with the resistor R73 disposed therebetween. Thus, because the bias adjustment circuit 70 can promptly adjust the bias current to be supplied to the transistor Q1 at the driver stage, the destruction of the power amplifier circuit 10A can be prevented. In FIG. 7, the bias circuit 60 that supplies the bias current to the transistor Q2 is omitted.

Figure 8:
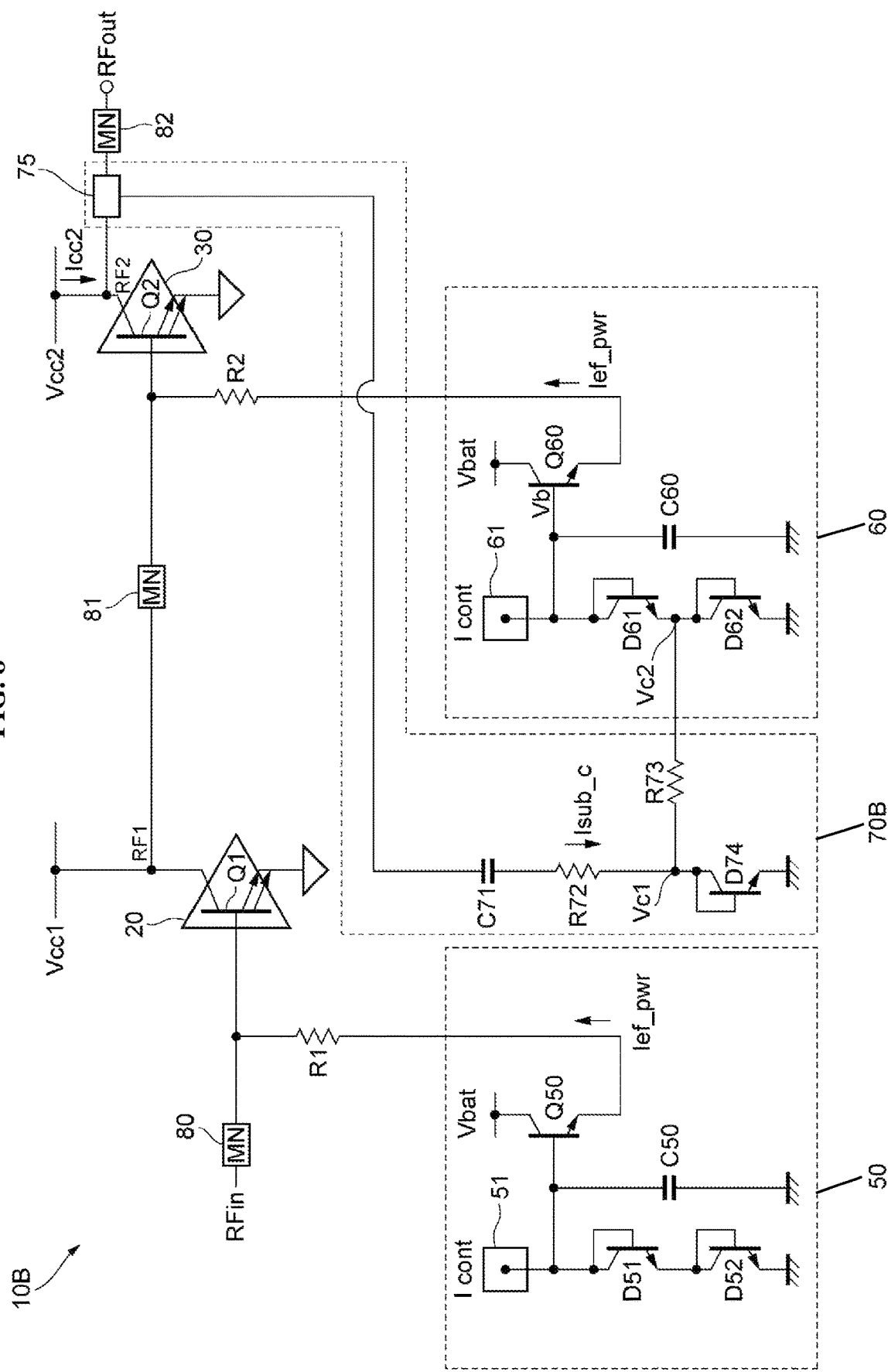
FIG. 8 illustrates an example configuration of a power amplifier circuit according to another variation.

As illustrated in FIG. 8, the power amplifier circuit 10B includes a coupler 75 connected to the collector of the transistor Q2, unlike the power amplifier circuit 10. One example of the coupler 75 may be a directional coupler. The RF signal RF2 is inputted to a bias adjustment circuit 70B through the coupler 75. Thus, the bias adjustment circuit 70B can adjust the bias current of the bias circuit 60 by removing the effect of reflected signals at the collector of the transistor Q2 and receiving the RF signal RF2 of the transistor Q2.

Figure 9:
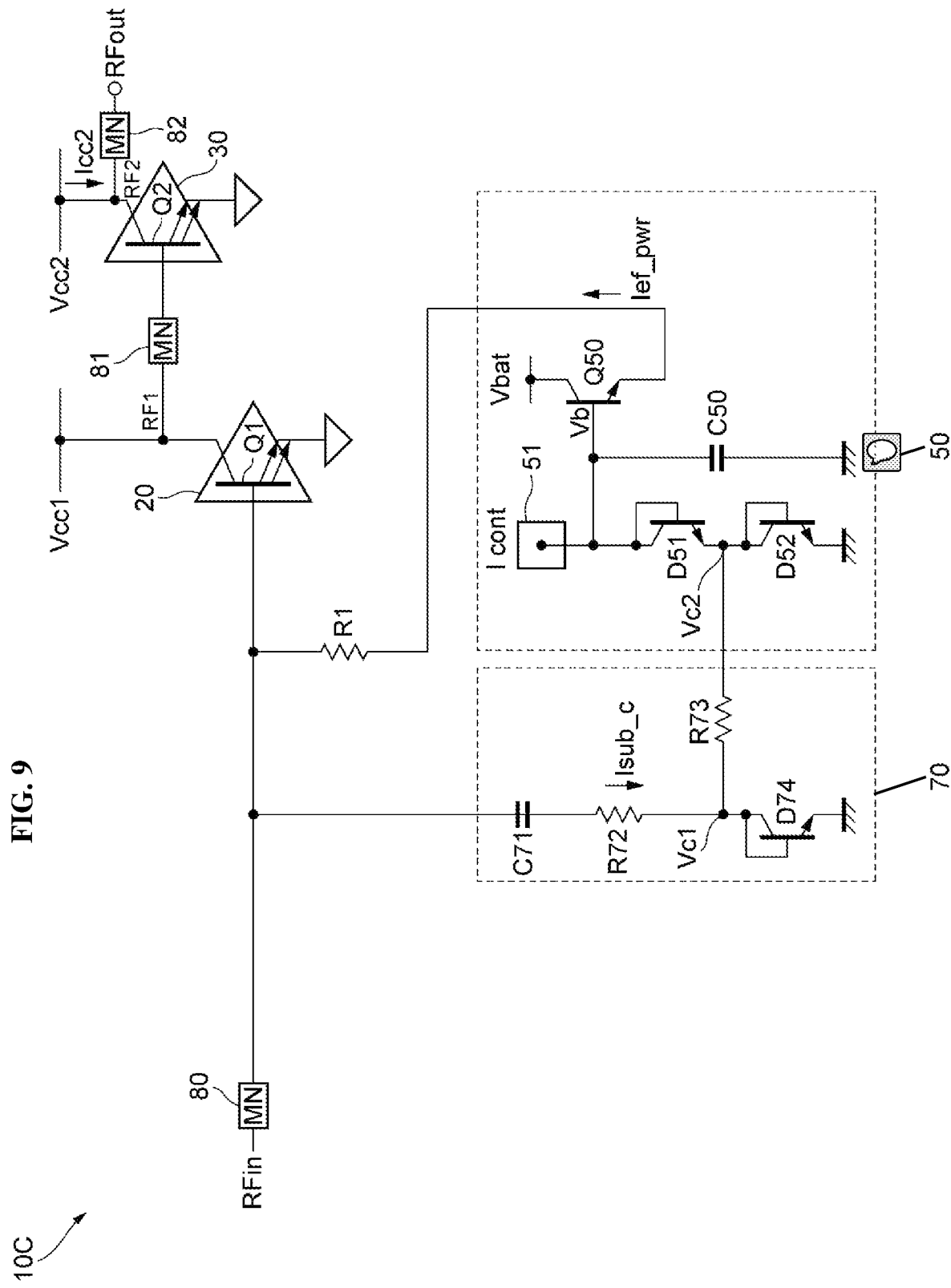
FIG. 9 illustrates an example configuration of a power amplifier circuit according to another variation.

As illustrated in FIG. 9, the power amplifier circuit 10C includes the bias adjustment circuit 70 that adjusts the bias current of the bias circuit 50 on the basis of the input signal RFin, unlike the power amplifier circuit 10. The diode D74 in the bias adjustment circuit 70 is connected to the anode of the diode D52 with the resistor R73 disposed therebetween. The anode of the diode D74 is connected to a first terminal of the capacitor C71 with the resistor R72 disposed therebetween. A second terminal of the capacitor C71 is connected to the base of the transistor Q1. That is, the current Isub_c based on the input signal RFin is supplied to the anode of the diode D74 through the resistor R72. Thus, because the bias adjustment circuit 70 can promptly adjust the bias current to be supplied to the transistor Q1 at the driver stage, the destruction of the power amplifier circuit can be prevented. In FIG. 9, the bias circuit 60 that supplies the bias current to the transistor Q2 is omitted.

Figure 10:
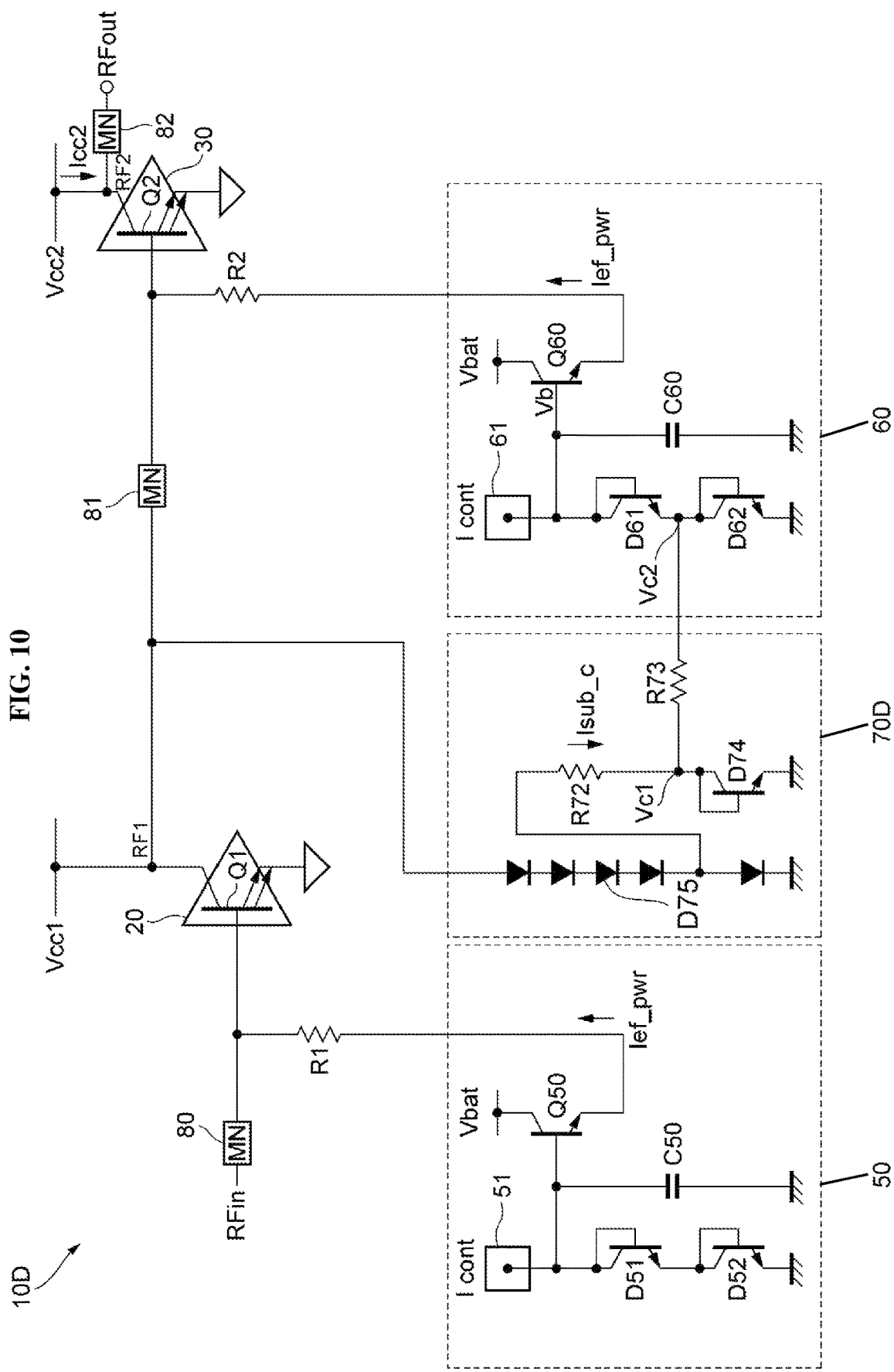
FIG. 10 illustrates an example configuration of a power amplifier circuit according to another variation.

As illustrated in FIG. 10, the power amplifier circuit 10D includes a plurality of diodes D75 connected in series, unlike the power amplifier circuit 10. In a bias adjustment circuit 70D, the RF signal RF1 is inputted to the plurality of diodes D75, and the current Isub_c based on the RF signal RF1 is supplied from the anode of any one of the plurality of diodes. Thus, the bias adjustment circuit 70D can promptly adjust the bias current on the basis of the signal level of the RF signal RF1.

Figure 11:
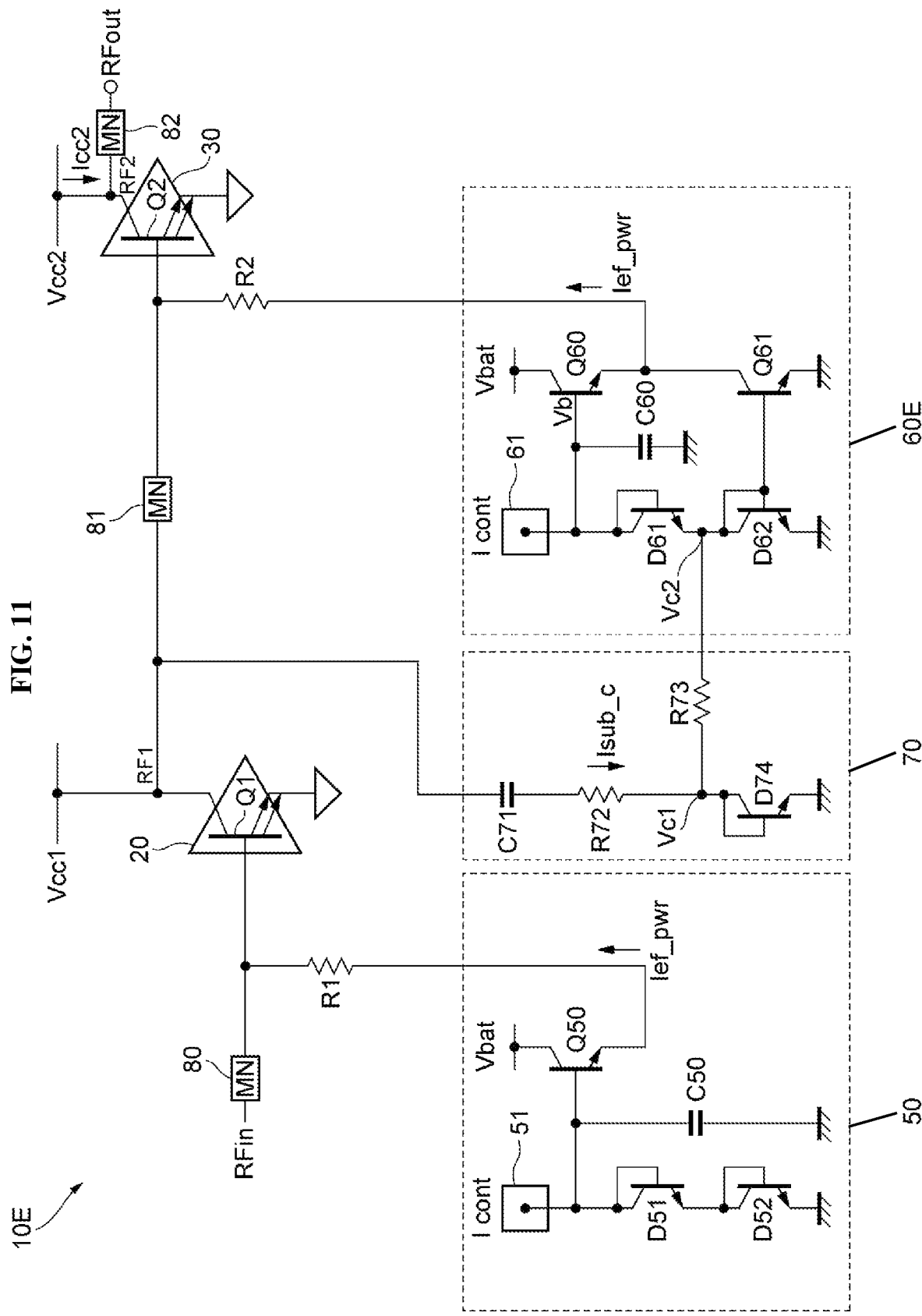
FIG. 11 illustrates an example configuration of a power amplifier circuit according to another variation.

As illustrated in FIG. 11, the power amplifier circuit 10E includes a bias circuit 60E including a transistor Q61 whose base is connected to the anode of the diode D62, collector is connected to the emitter of the transistor Q60, and emitter is connected to a ground, unlike the power amplifier circuit 10. Thus, the bias circuit 60E can efficiently supply the bias current or voltage.

Figure 12:
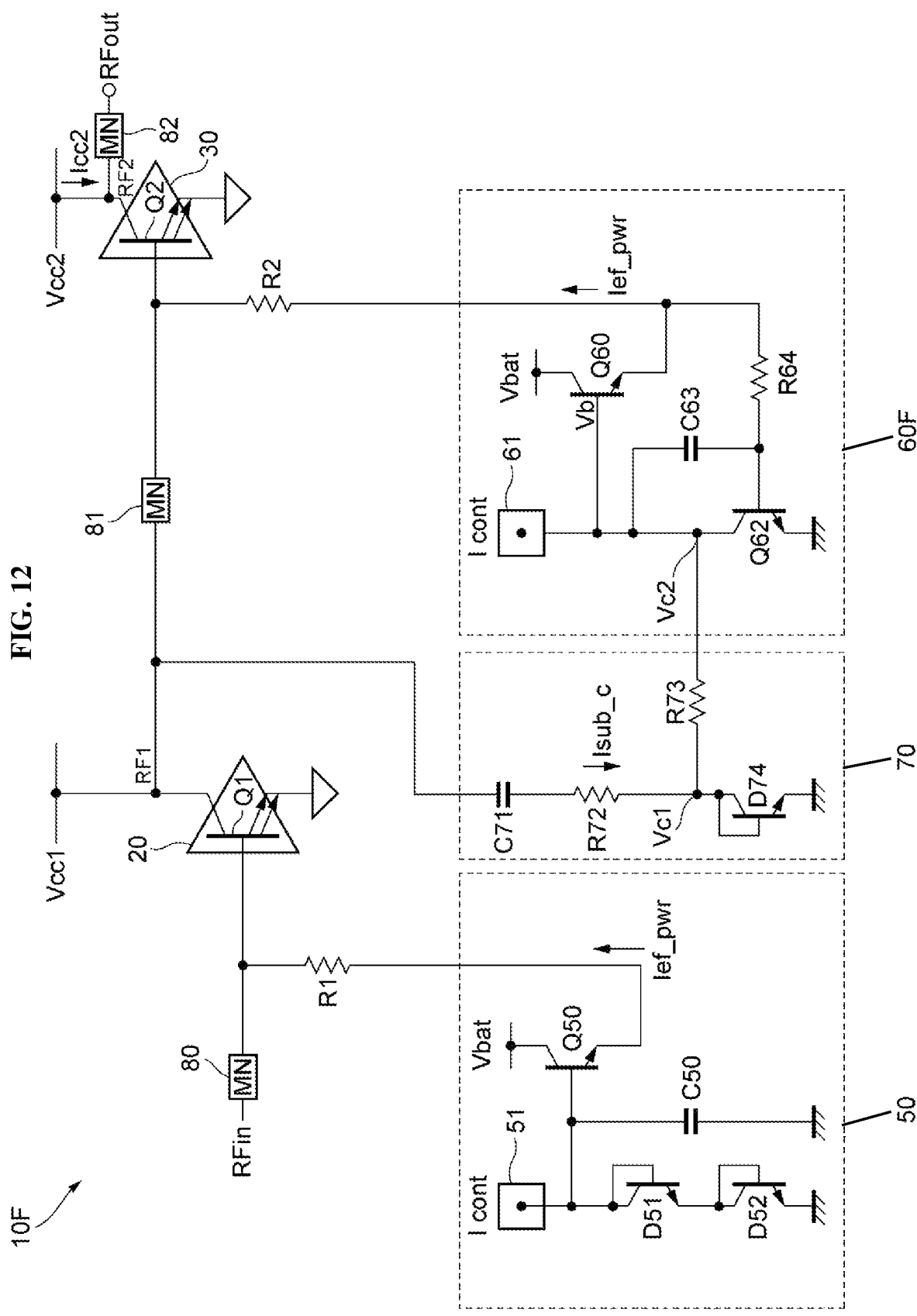
FIG. 12 illustrates an example configuration of a power amplifier circuit according to another variation.

As illustrated in FIG. 12, the power amplifier circuit 10F includes a bias circuit 60F including a transistor Q62, a capacitor C63, and a resistor R64, instead of the diodes D61 and D62, unlike the power amplifier circuit 10. The collector and base of the transistor Q62 are connected to each other with the capacitor C63 disposed therebetween. The collector of the transistor Q62 receives a constant current supplied from the power supply terminal 61. The collector of the transistor Q62 is connected to the base of the transistor Q60. The base of the transistor Q62 is connected to the emitter of the transistor Q60 with the resistor R64 disposed therebetween. Thus, the bias circuit 60F can efficiently supply the bias current or voltage.

Although not illustrated, the bias adjustment circuit 70 may not include the resistor R72 or R73 and may include either one of the resistors R72 and R73. In such cases, the configuration of the bias adjustment circuit 70 can be simplified.

Moreover, although not illustrated, the anode of the diode D74 in the bias adjustment circuit 70 may not be connected to the anode of the diode D62 with the resistor R73 disposed therebetween, and for example, the anode may be connected to the anode of the diode D61 with the resistor R73 disposed therebetween.

CONCLUSION

The power amplifier circuit 10 according to the preferred embodiment of the present disclosure includes the transistor Q1 (first amplifier) that amplifies the input signal RFin (first RF signal) supplied and that outputs the RF signal RF1 (second RF signal), the transistor Q2 (second amplifier) that amplifies the RF signal RF1 (second RF signal) supplied and that outputs the RF signal RF2 (third RF signal), the bias circuit 60 that supplies the bias current or voltage to the transistor Q1 (first amplifier) or the transistor Q2 (second amplifier), and the bias adjustment circuit 70 that adjusts the bias current or voltage on the basis of the input signal RFin (first RF signal), the RF signal RF1 (second RF signal), or the RF signal RF2 (third RF signal). The bias adjustment circuit 70 includes the diode D74 (first diode) having the anode to which the signal (control signal) based on the input signal RFin (first RF signal), the RF signal RF1 (second RF signal), or the RF signal RF2 (third RF signal) is inputted, and the cathode connected to a ground. The bias circuit 60 includes the transistor Q60 (bias transistor) that outputs the bias current or voltage on the basis of the voltage at the anode of the diode D74 (first diode). Thus, the effect of reflected waves can be suppressed, and the power gain of the power amplifier circuit 10 when the load changes can be suppressed.

The bias adjustment circuit 70 may further include the resistor R72 (first resistor). The input signal RFin, the RF signal RF1, or the RF signal RF2 (signal) may be inputted to the anode of the diode D74 (first diode) through the resistor R72 (first resistor). In that case, the desired bias current or voltage corresponding to the characteristics of the power amplifier circuit 10 can be generated.

The bias adjustment circuit 70 may further include the resistor R73 (second resistor). The voltage at the anode of the diode D74 (first diode) may be supplied to the bias circuit 60 through the resistor R73 (second resistor). In that case, the desired bias current or voltage based on the characteristics of the power amplifier circuit can be generated.

The bias circuit 60 may further include the diode D62 (second diode) having the anode to which the voltage at the anode of the diode D74 (first diode) is supplied and the cathode grounded, and the diode D61 (third diode) having the cathode connected to the anode of the diode D62 (second diode) and the anode to which the bias control voltage or current is supplied. The base or gate of the transistor Q60 (bias transistor) may be connected to the anode of the diode D61 (third diode). In that case, the bias circuit 60 can efficiently supply the bias current or voltage.

The bias adjustment circuit 70 may further include the capacitor C71 (capacitor) having the first terminal to which the input signal RFin (first RF signal), the RF signal RF1 (second RF signal), or the RF signal RF2 (third RF signal) is inputted, and the second terminal from which the signal is outputted. The capacitor C71 may function to cut a DC component of the collector voltage of the transistor Q1.

The bias adjustment circuit 70 may further include the coupler 75 coupled to the output path of the transistor Q2 (second amplifier) and configured to output the signal based on the RF signal RF2 (third RF signal). Because the coupler 75 can remove the effect of reflected waves, signals can be detected from the power stage.

The bias adjustment circuit 70 may further include the plurality of diodes connected in series. The RF signal RF1 (second RF signal) may be inputted to the plurality of diodes, and the signal based on the RF signal RF1 (second RF signal) may be outputted from the anode of any one of the plurality of diodes. In that case, the power amplifier circuit 10 can adjust the voltage level detected by the bias adjustment circuit 70.

The above embodiment is described for facilitating the understanding of the present disclosure and is not intended to restrict the present disclosure. The present disclosure can be changed or improved without departing from its spirit and includes its equivalents. That is, the scope of the present disclosure also encompasses ones in which a person skilled in the art makes a design change to the embodiment as appropriate as long as they have the features of the present disclosure. The elements included in the embodiment, the arrangement of them, and the like are not limited to the illustrated examples and can be changed as appropriate.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
a first amplifier configured to amplify a first radio frequency (RF) signal supplied to the first amplifier, and to output a second RF signal;
a second amplifier configured to amplify the second RF signal supplied to the second amplifier, and to output a third RF signal;
a bias circuit configured to supply a bias current or a bias voltage to the first amplifier or to the second amplifier; and
a bias adjustment circuit configured to adjust the bias current or the bias voltage based on the first RF signal, the second RF signal, or the third RF signal,
wherein the bias adjustment circuit comprises a first diode having an anode to which a control signal is input, and a cathode connected to ground, the control signal being indicative of the first RF signal, the second RF signal, or the third RF signal,
wherein the bias circuit comprises a bias transistor configured to output the bias current or the bias voltage based on a voltage at the anode of the first diode,
wherein the first amplifier has a first supply terminal to which the first RF signal is supplied, and a first output terminal from which the second RF signal is output,
wherein the second amplifier has a second supply terminal connected to the first output terminal of the first amplifier and to which the second RF signal is supplied, and a second output terminal from which the third RF signal is output,
wherein the bias transistor has an emitter connected to the first supply terminal or to the second supply terminal,
wherein the anode of the first diode is connected to the first supply terminal, the first output terminal, or the second output terminal, and
wherein the bias transistor further has a base connected to the anode of the first diode.

2. The power amplifier circuit according to claim 1,
wherein the bias adjustment circuit further comprises a first resistor, and
wherein the control signal is input to the anode of the first diode through the first resistor.

3. The power amplifier circuit according to claim 2, wherein the anode of the first diode is connected to the first resistor.

4. The power amplifier circuit according to claim 1,
wherein the bias adjustment circuit further comprises a second resistor, and
wherein the voltage at the anode of the first diode is supplied to the bias circuit through the second resistor.

5. The power amplifier circuit according to claim 4, wherein the anode of the first diode is connected to the second resistor.

6. The power amplifier circuit according to claim 1,
wherein the bias circuit further comprises:
a second diode having an anode to which the voltage at the anode of the first diode is supplied, and a grounded cathode, and
a third diode having a cathode connected to the anode of the second diode, and an anode to which a bias control voltage or a bias control current is supplied, and
wherein a base of the bias transistor is connected to the anode of the third diode.

7. The power amplifier circuit according to claim 6,
wherein the anode of the second diode is connected to the anode of the first diode, and
the anode of the third diode is connected to a power supply terminal from which the bias control voltage or the bias control current is supplied.

8. The power amplifier circuit according to claim 1, wherein the bias adjustment circuit further comprises a capacitor configured to receive the first RF signal, the second RF signal, or the third RF signal at a first terminal, and to output the control signal from a second terminal.

9. The power amplifier circuit according to claim 8,
wherein the first terminal of the capacitor is connected to the first supply terminal, the first output terminal, or the second output terminal, and
wherein the second terminal of the capacitor is directly connected to the anode of the first diode, or is connected to the anode of the first diode with the first resistor connected to the anode of the first diode and disposed between the first diode and the second terminal of the capacitor.

10. The power amplifier circuit according to claim 1, wherein the bias adjustment circuit further comprises a coupler coupled to an output path of the second amplifier, and configured to output the control signal based on the third RF signal.

11. The power amplifier circuit according to claim 1, wherein the bias adjustment circuit further comprises a plurality of diodes connected in series,
wherein the second RF signal is input to the plurality of diodes, and
wherein the control signal is based on the second RF signal, and is output from an anode of a first one of the plurality of diodes.

12. The power amplifier circuit according to claim 11, wherein an anode of a second one of the plurality of diodes is connected to the first output terminal, and
wherein the anode of the first one of the plurality of diodes is connected to the anode of the first diode.

13. A power amplifier circuit comprising:
an amplifier configured to amplify a first radio frequency (RF) signal supplied to the amplifier, and to output a second RF signal;
a bias circuit configured to supply a bias current or a bias voltage to the amplifier; and
a bias adjustment circuit configured to adjust the bias current or the bias voltage based on the first RF signal or the second RF signal,
wherein the bias adjustment circuit comprises a first diode having an anode to which a signal based on the first RF signal or the second RF signal is input, and a cathode connected to a ground,
the bias circuit comprises a bias transistor configured to output the bias current or the bias voltage based on a voltage at the anode of the first diode,
wherein the amplifier has a supply terminal to which the first RF signal is supplied, and an output terminal from which the second RF signal is output,
wherein the bias transistor has an emitter connected to the supply terminal,
wherein the anode of the first diode is connected to the output terminal, and
wherein the bias transistor has a base connected to the anode of the first diode.

* * * * *